United States Patent [19]

Ealey et al.

[11] Patent Number: 4,932,119

[45] Date of Patent: Jun. 12, 1990

[54] METHOD OF MAKING STANDARD ELECTRODISPLACIVE TRANSDUCERS FOR DEFORMABLE MIRRORS

[75] Inventors: Mark A. Ealey; Paul Davis; Richard DeVito, all of Middlesex, Mass.

[73] Assignee: Litton Systems, Inc., Lexington, Mass.

[21] Appl. No.: 329,907

[22] Filed: Mar. 28, 1989

[51] Int. Cl.$^5$ ............................................. H01L 41/22
[52] U.S. Cl. .................................... 29/593; 29/25.35; 310/328; 350/320
[58] Field of Search ....................... 350/610, 607, 320; 310/328; 29/25.35, 593

[56] References Cited

U.S. PATENT DOCUMENTS 4,845,399  7/1989  Yasuda et al. .................. 310/328 X

*Primary Examiner*—Carl E. Hall
*Attorney, Agent, or Firm*—Michael H. Wallach; Robert F. Rotella

[57] ABSTRACT

A construction for electrodisplacive transducers for use in deformable mirrors in which the transducer is assembled from two or more segments of electrodisplacive material. Each segment contains multiple stacked layers of electrodisplacive material which are separated from adjacent layers by electrodes. During manufacture the segments may be individually tested and sorted by the stroke that they produce for a given electrical input signal applied to the stacked layers. Segments are selected and fastened to each other so that the total stroke produced by the selected segments equals the stroke required from the actuator.

8 Claims, 1 Drawing Sheet

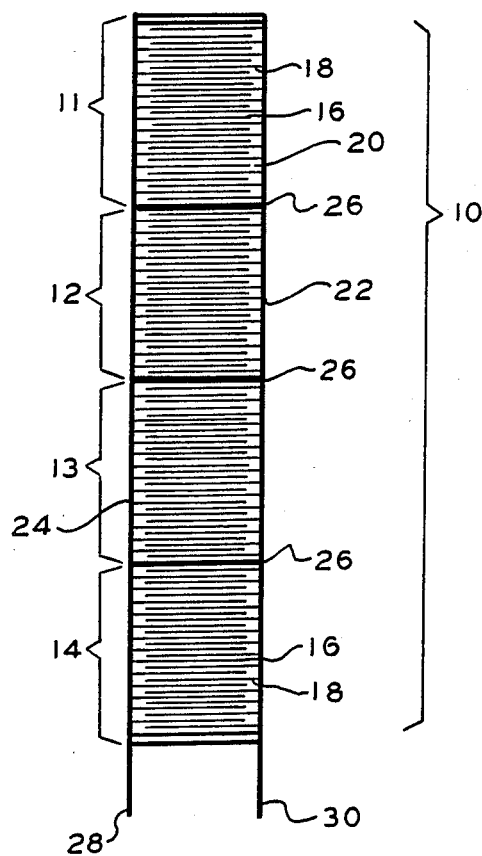

METHOD OF MAKING STANDARD ELECTRODISPLACIVE TRANSDUCERS FOR DEFORMABLE MIRRORS

BACKGROUND OF INVENTION

1. Field of Invention

This invention relates to deformable mirrors in general, and more particularly to electrodisplacive transducers for selectively deforming a mirror's reflecting surface and a method of manufacturing transducers for deformable mirrors.

2. Description of the Prior Art

The use of multilayer electrodisplacive actuators in deformable mirrors is well know in the prior art. See, for example, U.S. Pat. No. 4,657,358 which issued Apr. 14, 1987 and which discloses the use of multiple actuators for selectively imparting deformations into the reflecting surface of a deformable mirror. The actuators are each composed of multiple layers of electrodisplacive material, for example lead magnesium niobate, which are made to elongate by the application of an electrical field between each layer of the electrodisplacive material.

Those skilled in the art of deformable mirror construction are aware that the operation of a deformable mirror relies on the use of actuators which can be selectively operated to impart a precise force against the mirror's reflecting surface to impart precisely controlled deformations across the reflecting surface. For deformable mirrors utilizing large numbers of actuators to effect precise control of the mirror's reflecting surface, it is important that each actuator produce the same deformation in the mirror's reflecting surface upon the application of electrical signals of equal magnitude. Failure to produce uniform deformations among different actuators results in errors being introduced into the surface configuration of the reflecting surface. While such nonlinearities between actuators in a mirror may be overcome by adjusting the bias applied to each actuator to tailor the actuators response curve, i.e., the amount of deformation provided for a given electrical signal, such adjustments are time consuming and frequently difficult to achieve due to the requirement to individually test and balance each of many actuators in the deformable mirror.

One approach for overcoming inconsistencies in response between actuators destined for use in a deformable mirror is to test each actuator with a common electrical signal prior to its placement in a deformable mirror. During the testing cycle, those actuators which exhibit a common response, i.e., which exhibit the same elongation upon the application of a common electrical signal, are chosen for use in a particular deformable mirror. Other actuators which exhibit response curves differing from the chosen units are rejected.

One method for manufacturing actuators for use in deformable mirrors involves the use of multiple layers of electrodisplacive material which are stacked upon each other to provide increased actuator stroke, i.e., elongation in the direction parallel to the applied electric field. The number of layers of electrodisplacive material in each actuator is determined by the stroke that each actuator is to produce to deform the mirror's reflecting surface. The amount of stroke produced by an actuator, is directly proportional to the number of layers of electrodisplacive material. To achieve significant mechanical displacement (i.e., stroke) along the axis of the layers of actuator material, each actuator must be composed of many layers of electrodisplacive material. It is not uncommon to utilize actuators of 60 or more layers of electrodisplacive material to permit a stroke of 5 microns to be produced utilizing an electrical signal of approximately 200 volts. Layers of electrodisplacive material are connected mechanically in series by bonding each layer of actuator material to adjacent layers above and below, and electrically in parallel. The mechanical connection between adjacent layers permits each layer's stroke to be added to the stroke of the other layers in the actuator, thereby yielding a larger stroke than that achievable with a single layer of electrodisplacive material.

The layers of electrodisplacive material are manufactured by tape casting a slurry of electrodisplacive material, for example lead magnesium niobate in a binder, to produce sheets of electrodisplacive material having a specified thickness. The individual layers of electrodisplacive material are then coated on one side with a platinum ink in a pattern to produce an electrode of predetermined dimensions in the completed actuators. The layers of electrodisplacive material are then stacked upon each other and are pressed into a block which is then fired while held under pressure in an oven to produce a ceramic structure. The block is then diced or core drilled to produce multilayer actuators. The electrode patterns are then externally connected in alternating layers to permit an electric field to be generated between each layer of electrodisplacive material by the application of an electrical signal to the layers of electrodes. The foregoing manufacturing process is labor-intensive, requiring considerable attention by skilled technicians to assure the manufacture of actuators without defects. Despite the care used during the manufacturing process, it is possible to manufacture actuators in which a substantial proportion of those manufactured must be rejected due to defects which develop during the manufacturing process.

One problem with manufacturing actuators in the foregoing manner is that actuators frequently will have one or more defective layers, i.e., layers of electrodisplacive material which will not exhibit any mechanical deformation, or reduced deformation upon the application of an electrical signal, thereby resulting in an actuator having less then the desired mechanical displacement for a given input signal. In addition, for the foregoing and other reasons, such as continuity defects in the electrode patterns, it is likely that an appreciable number of actuators having many layers of electrodisplacive material will fail to pass quality control inspections and will be required to be scrapped. The scrapping process not only results in material waste but, more importantly, in labor being expended on fabricating and testing those units which fail to pass quality control tests. The percentage of actuators which must be rejected becomes especially critical in the manufacture of deformable mirrors having large optical apertures which utilize many channels (i.e., many actuators) to provide precise control of the mirror's entire reflecting surface.

Still another problem with multiple layer actuators is that actuators must be tested to determine the amount of stroke that each actuator yields for the application of a fixed electrical signal and those actuators which do not produce a common stroke cannot be used in the same deformable mirror without the use of additional electronic controls to tailor each actuator's response so that all actuator's in the mirror exhibit a uniform response upon the application of a common signal. The need for additional electronic control reduces the reliability of the deformable mirror since the control system becomes an additional source of component failure. In addition the use of a control circuit to tailor the response of the mirror's actuators requires additional manpower to properly perform the initial adjustment of the control circuit.

SUMMARY OF THE INVENTION

A principal object of this invention is to produce multilayer actuators having closely matched strokes for a given applied voltage for use in deformable mirrors.

Another object of the invention is to reduce the amount of labor required to manufacture a large number of actuators having closely matched tolerances.

Still another object of the invention is to reduce the number of actuators which must be scrapped due to their failure to match the strokes achieved by other actuators intended for use in a deformable mirror.

Another object is to produce multilayer actuators having uniform stroke specifications which may be manufactured from segments consisting of multiple layers of electrodisplacive material having mechanical strokes which differ from each other.

The above objects and other advantages of the invention are achieved by manufacturing actuators in two or more segments. Each segment has a fixed number of layers of electrodisplacive material with electrode patterns printed on each layer of electrodisplacive material. The segments are mechanically bonded together to form an actuator of the desired length. The alternating electrodes in each segment are electrically connected together to permit an electric field to be generated between each layer of electrodisplacive material. By testing each segment for mechanical and electrical operation prior to assembly of the segments into an actuator, the number of actuators which must be rejected due to electrical failure and/or failure of one or more segments to achieve a specified stroke is reduced. In addition, those segments which would otherwise be rejected due to their failure to achieve a given stroke or because they produce a stroke greater than that desired, is reduced. The use of segments sorted by stroke to manufacture actuators having a required stroke permits greater flexibility in the replacement of defective actuators, since actuators having a specific stroke do not have to be manufactured and/or stored to replace those units later found to be defective.

BRIEF DESCRIPTION OF THE DRAWINGS

The foregoing objects and other advantages of the invention will be readily understood from a detailed description of a preferred embodiment when read in conjunction with the accompanying drawings in which:

FIG. 1 is a plan view along the side of an electrodisplacive actuator constructed in accordance with the teachings of the invention.

DETAILED DESCRIPTION OF A PREFERRED EMBODIMENT

Referring to the drawing, FIG. 1 shows an electrodisplacive actuator 10 constructed in accordance with the teachings of the invention. The actuator 10 is comprised of four segments, 11, 12, 13 and 14, each containing multiple layers 16 of electrodisplacive material, for example lead magnesium niobate. Each layer 16 of electrodisplacive material has a top electrode 18 and a bottom electrode 20. The electrode layers 18 and 20 permit the application of an electrical signal to the electrodisplacive material to produce an electric field between each layer 16 of electrodisplacive material. As is readily appreciated by those skilled in the art, the application of an electric field to a layer of electrodisplacive material will produce a change in dimensions of the electrodisplacive material in the direction of the electric field. Consequently, each layer 16 of electrodisplacive material may be made to elongate along an axis perpendicular to the layer 16 by the application of an electrical signal between the electrodes 18 and 20.

Segments 11, 12, 13 and 14 shown in the preferred embodiment disclosed herein are composed of identical numbers of layers of electrodisplacive material 16. As is known to those skilled in the art, each segment may be manufactured by tape casting multiple layers of electrodisplacive material into thin tapes of material, each, for example, 0.015 inches thick. The electrodisplacive material used for casting the tapes has an organic binder mixed therewith to plasticize the material to facilitate its casting into thin sheets or tapes of uniform density. After sufficient drying time, an electrode pattern is screen printed on the top surface of each tape. The electrode pattern may be produced by screening on an electrically conductive material, for example a platinum ink, in a manner to yield the overlapping electrode pattern shown in FIG. 1. The electrode pattern will, upon assembly of multiple layers of the actuator material, form the electrical conductive planes 16 and 18 shown in FIG. 1, which will permit an electric field to be generated between each of the layers 16 of electrodisplacive material. After the tapes have been dried, a number of layers of electrodisplacive material, for example 20 layers, are stacked upon each other with the electrode patterns on the stacked tapes forming the pattern shown in FIG. 1. The tapes are pressed into a block by the application of pressure to the stacked layers and then placed in an oven to burn off the organic binder and to initiate ceramic densification of the material. The blocks may thereafter be fired or sintered to further densify the ceramic structure and increase the structural integrity of the layered electrodisplacive material. The fired block containing multiple layers of electrodisplacive material may then be cut into multilayer segments, for example into the square segments 11, 12, 13 and 14 of FIG. 1. Alternating layers of electrodes in each segment are electrically connected to each other using a connector consisting of a strip of electrically conductive material along the edge of each layer 16, for example a ribbon of solder or platinum ink 22 and 24 as is shown in FIG. 1. The connectors 22 and 24 permit an electric signal to be applied to each of the layers 16 of electrodisplacive material in each stack.

After the multiple layers of electrodisplacive material have been cut into stacks and the electrical connectors 22 and 24 have been printed on the outside of each stack, the stacks are tested to measure their mechanical elongation, or stroke, for a known electrical signal. For example, an electrical signal of 300 volts is applied between conductors 22 and 24 and the extent of elongation along the axis of the segment is measured. The segments are then sorted to group segments having common response curves i.e., to sort those segments producing the same or similar mechanical elongation for a given electrical input from others having differing mechanical responses. Each segment is also visually inspected to insure that all layers 16 of electrodisplacive material are uniformly bonded to each other and that voids are not present between layers.

Construction of an actuator having a desired mechanical response for a given electrical input is achieved by selecting segments having mechanical strokes whose sum equals the stroke desired from the completed actuator. Since some segments will have a greater stroke than others, the desired mechanical stroke can be achieved by combining segments having a greater stroke than average with those having a lesser stroke than average. It is merely necessary to make certain that the total stroke of the combined segments closely matches the stroke desired for the completed actuator.

Two or more segments whose total stroke is approximately equal to that required of the completed actuator are thereafter bonded together using an adhesive or frit bond 26. During the bonding the individual segments are aligned to insure that their axes of elongation are coincident with each other. Upon completion of the bonding, the connectors 22 and 24 are electrically connected to the connectors 22 and 24 for adjacent segments to permit all layers of the bonded segments to be controlled by a common electrical input through lines 28 and 30. After the segments have been bonded together the completed actuator is tested by the application of an electrical signal.

The foregoing apparatus and method of manufacture of actuators permits the more efficient manufacture of actuators with reduced rejection due to the inability of manufactured actuators to meet their performance criteria. Changes in the apparatus and method may become obvious to those skilled in the art after review of the material disclosed herein. For example, while the preferred embodiment has shown an actuator having a square cross-section, it should be evident that the teachings contained herein could be equally applied to actuators of other cross-sectional shapes, for example cylindrical actuators. It is intended that the preferred embodiment described herein be only illustrative of the invention and that the scope of the invention only be limited by the interpretation of the appended claims.

We claim:

1. A method of manufacturing electrodisplacive transducers for use in selectively deforming the reflecting surface of a deformable mirror, said method comprising the steps of:

a. Casting a layer of electrodisplacive material to form a flat sheet of electrodisplacive material;

b. Interleaving a fixed number of layers of electrodisplacive material with layers of electrically conductive material;

c. Drying the interleaved layers of electrodisplacive material and electrically conductive material under pressure to form a ceramic structure;

d. Dicing the interleaved layers of electrodisplacive material and electrically conductive material to form segments of electrodisplacive material having a common number of layers of electrodisplacive material;

e. Testing each segment by applying a fixed electrical signal to the electrical layers of each segment and measuring the amount of elongation produced in each segment by the fixed electrical signal;

f. Sorting the segments by the amount that each segment elongates when a fixed electrical signal is applied to each stack;

g. Selecting segments to produce an electrodisplacive actuator capable of producing a known amount of elongation by selecting segments the sum of whose total elongation equals the desired elongation for the electrodisplacive transducer;

h. Mechanically bonding each of the selected segments to each other along the axis of elongation; and i. Electrically connecting alternating ones of the electrically conducting layers in the actuator to each other to permit an electric field to be generated between each layer of electrodisplacive material in the actuator.

2. The method of claim 1 wherein said layer of electrically conductive material is a layer of platinum ink.

3. The method of claim 2 wherein said segments are joined together using a frit bond.

4. The method of claim 3 wherein the thickness of the frit bond is equal to or less than the thickness of a single layer of electrodisplacive material in said segments.

5. The method of claim 3 further including the step of aligning said segments during the step of frit bonding to insure that said segments are in substantial alignment with each other upon completion of the step of frit bonding.

6. The method of claim 1 wherein the electrodisplacive material is lead magnesium niobate.

7. The method of claim 1 wherein the step of dicing results in segments having a square shape.

8. The method of claim 1 wherein the total number of layers of electrodisplacive material in each segment is approximately twenty or less.

* * * * *